US 6,615,310 B1

(12) United States Patent
Ridings (10) Patent No.: US 6,615,310 B1
(45) Date of Patent: Sep. 2, 2003

(54) LOSSLESS DATA COMPRESSOR WITH ALL CAM WORDS AVAILABLE

(75) Inventor: Jeffery Charles Ridings, Hutto, TX (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 09/574,183

(22) Filed: May 18, 2000

(51) Int. Cl.[7] ............................................. G06F 12/00
(52) U.S. Cl. .................... 711/108; 365/49; 365/189.05; 365/230.08
(58) Field of Search ............................. 711/108; 707/1; 365/49, 233, 189.05, 230.08

(56) References Cited

U.S. PATENT DOCUMENTS

| | | | | |
|---|---|---|---|---|
| 5,497,488 A | * | 3/1996 | Akizawa et al. ............... | 707/6 |
| 5,602,764 A | * | 2/1997 | Eskandari-Gharnin et al. .. | 341/55 |
| 5,642,114 A | * | 6/1997 | Komoto et al. ............... | 341/67 |
| 5,652,878 A | | 7/1997 | Craft ............................ | 707/1 |
| 5,877,714 A | * | 3/1999 | Satoh ........................... | 341/50 |
| 5,903,230 A | | 5/1999 | Masenas ....................... | 341/51 |
| 6,163,473 A | * | 12/2000 | Hannum ....................... | 365/49 |

* cited by examiner

Primary Examiner—Pierre-Michel Bataille
(74) Attorney, Agent, or Firm—Duke W. Yee; Robert M. Carwell; Lisa L. Yociss (57) ABSTRACT

A method, system, and apparatus for making all content addressable memory words available for comparison in a data compressor is provided. In one embodiment, new data, to be compared with old data, is launched into a master. The new data from the master latch is launched into a slave latch and compare logic for each of a plurality of content addressable memory words within a content addressable memory (CAM). After the comparison has been made between the new data and the old data contained within the CAM word, the new data from the slave latch is written into the one of the plurality of content addressable memory words. Thus, each CAM word, including the CAM word that will be overwritten by the new data, is available for comparison to the new data.

22 Claims, 4 Drawing Sheets

LOSSLESS DATA COMPRESSOR WITH ALL CAM WORDS AVAILABLE

CROSS REFERENCE TO RELATED APPLICATIONS

The present application is related to abandoned U.S. patent application Ser. No. 09/574,172 entitled "Lossless Data Compressor Using a Single Match Reduction Term" filed even date herewith. The content of the above mentioned commonly assigned, copending U.S. Patent Application is hereby incorporated herein by reference for all purposes.

BACKGROUND OF THE INVENTION

1. Technical Field

The present invention relates generally to a method, system, and apparatus for data compression and, more particularly, to a method, system and apparatus for lossless data compression.

2. Description of Related Art

Data compression is the process of encoding data to take up less storage space. Digital data is compressed by finding repeatable patterns of binary 0s and 1s. The more patterns can be found, the more the data can be compressed. Text can generally be compressed to about 40% of its original size, and graphics files from 20% to 90%. Some files compress very little. It depends entirely on the type of file and compression algorithm used.

There are numerous compression methods in use. Two major technologies are Huffman coding and Lempel-Ziv-Welch (LZW), representing examples of the statistical and dictionary compression methods.

When a compression algorithm is packaged for use for a specific platform and file format, it is called a codec (compressor/decompressor). ADPCM, PCM and GSM are examples of codecs for sound, and Indeo, Cinepak and MPEG are examples of codecs for video.

In the DOS/Windows world, PKZIP is the most widely-used compression application.

When text and financial data are compressed, they must be decompressed back to a perfect original, bit for bit. This is known as lossless compression. However, audio and video can be compressed to as little as 5% of its original size using lossy compression. Some of the data is actually lost, but the loss is not noticeable to the human ear and eye.

One method of data compression is to write data words to sequential content addressable memory (CAM) locations. CAMs are memory storage devices that are accessed by comparing the content of the data stored in it rather than by addressing predetermined memory locations within the storage device. While a word is being written to a CAM, it is also compared to previously written words within the CAM. Multiple sequential matches are compressed using logic such as discussed above. Traditionally, since the compare and write steps utilize the same data, the CAM word being written is not used in determining a match. The result is that there is always one CAM word not available for matching. Therefore, a system, method, and apparatus for making all CAM words available for matching is desirable. Such functionality statistically increases the likelihood of matching the current CAM location, thus more efficiently compressing the data. The smaller the CAM size, the larger the increase in the likelihood of matching the current CAM location that will be provided by making all CAM words available for matching.

SUMMARY OF THE INVENTION

The present invention provides a method, system, and apparatus for making all content addressable memory words available for comparison by a data compressor. In one embodiment, new data, to be compared with old data, is launched into a master latch. The new data from the master latch is launched into both a slave latch and compare logic for each of a plurality of content addressable memory words within a content addressable memory (CAM). After the comparison has been made between the new data and the old data contained within the CAM word, the new data from the slave latch is launched into the one of the plurality of content addressable memory words. Thus, each CAM word, including the CAM word that will be overwritten by the new data, is available for comparison to the new data.

BRIEF DESCRIPTION OF THE DRAWINGS

The novel features believed characteristic of the invention are set forth in the appended claims. The invention itself, however, as well as a preferred mode of use, further objectives and advantages thereof, will best be understood by reference to the following detailed description of an illustrative embodiment when read in conjunction with the accompanying drawings, wherein:

DETAILED DESCRIPTION OF THE PREFERRED EMBODIMENT

Figure 1:
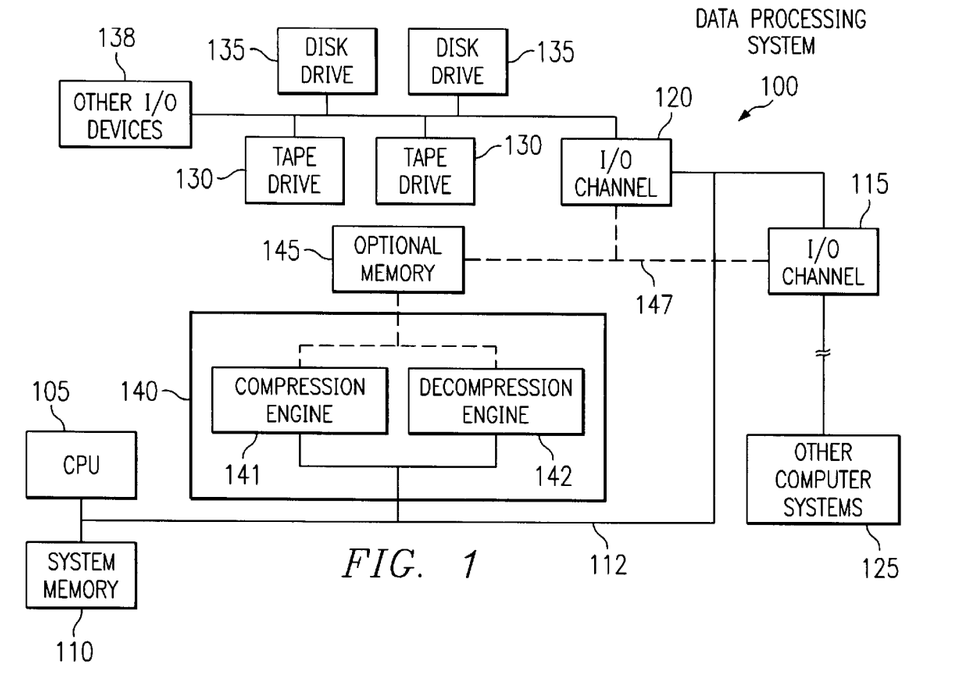
FIG. 1 depicts a block diagram of a data processing system in which the present invention may be implemented.

With reference now to the figures, and in particular, with reference now to FIG. 1, a block diagram of a data processing system in which the present invention may be implemented is depicted. Data processing system 100 includes a central processing unit (CPU) 105 that communicates with system memory 110. CPU 105 also communicates on bus 112 with input/output channels or adapters 115 and 120. Through input/output channel 115, CPU 105 may communicate with other computer systems 125 and through input/output channel 120, CPU 105 may communicate with tape drives 130, disk drives 135, or other input/output devices 138 such as, for example, optical disks.

In one embodiment, data processing system 100 may also include a compression/decompression engine 140 on bus 112. Compression/decompression engine 140 includes a compression engine 141 and decompression engine 142. Compression/decompression engine 140 includes hardware for making all CAM words available for comparison. Compression/decompression engine 140 may be invoked by an operating system file handler running on CPU 105 to perform compression or decompression of data transmitted or received through one of input channels 115 and 120. Compression/decompression engine 140 may utilize system memory 110 or an optional memory 145 while performing the desired compression or decompression of data. If optional memory 145 is utilized, the compressed or decompressed data may be transmitted directly to and from I/O channels 115 and 120 on optional bus 147.

In brief, compression engine 141 is designed to receive a stream of data bytes, store them in a "history memory" (i.e. the CAM) and compare each new byte to the stored bytes in order to detect repeated patterns of bytes so that the pattern of repetition can be used as a basis for reducing the amount of data that needs to be transmitted or stored. If new data to be thus processed includes a "string" or sequence of two or more data bytes that have been processed before, then a token comprising a value length and a relative address of the previously processed data string will be generated. Since the new data which includes such string of previously processed data bytes can be expressed using fewer bits of information than that contained in the data string itself, the data stream to be transmitted or stored is effectively compressed. If the new data to be processed does not form part of a previous data string existing in memory, there can be no compression and the raw data must be transmitted as a "raw token".

Decompression engine 142 is constructed with a similar "history memory" and corresponding decoding logic in order to effectively recover the original data byte stream by decoding the transmitted compressed word tokens and raw tokens.

One compression algorithm which may be used in conjunction with the present invention is the Lempel/Ziv (L-Z) algorithm, which is described in "Compression of Individual Sequences via variable Rate Coding" by Lempel and Ziv in IEEE Transactions on Information Theory, September, 1978, pages 530–536. One implementation of this algorithm is commonly referred to as an "LZ1" type algorithm. When using the LZ1 algorithm, a start address and length of the matching string can be calculated, encoded and generated as a token. For example, a raw token is generated as a "0" followed by the raw byte. A compressed word token is passed as a "1" followed by a binary identification of the length of the matching string and a series of bits identifying the starting location of matching string in a memory array (called the displacement). A "control token" may also be generated which starts with either 1's or 0's and is followed with four bits designating the control instructions. Finally, an "end token", comprising only 1's in a series, may designate the end of a compressed data stream.

Table 1 shows the codes used to designate the length of a compressed data word string. This type of coding is a modified logarithmic coding wherein shorter strings utilize shorter codes and longer strings utilize longer codes. This is a useful coding technique when the frequency of shorter strings is substantially greater than the frequency of longer strings. The displacement is specified with an 11 bit value in an embodiment where the memory array has a 2 Kbyte size. A shorter displacement may be used with a memory array having fewer sections and a smaller size, e.g., 1 Kbyte or 512 byte. In the following table, it should be noted that there are five groups of possible code lengths, each group comprising 2, 4, 6, 8, or 12 bits.

TABLE 1

| Codes Used to Designate Compressed Word Length | |
| --- | --- |
| Code Field | Compressed Word Length |
| 00 | 2 words |
| 01 | 3 words |
| 10 00 | 4 words |
| 10 01 | 5 words |
| 10 10 | 6 words |
| 10 11 | 7 words |
| 110 000 | 8 words |
| . . . . . . | . . . . . . |
| . . . . . . | . . . . . . |
| 110 111 | 15 words |
| 1110 0000 | 16 words |
| . . . . . . . . | . . . . . . . . |
| . . . . . . . . | . . . . . . . . |
| 1110 1111 | 31 words |
| 1111 0000 | 32 words |
| . . . . . . . . . . . . | |
| | . . . . . . |
| . . . . . . . . . . . . | |
| | . . . . . . |
| 1111 1110 1111 | 271 words |

An overview of how the above compression algorithm works can be provided by a simple example involving the compression of the phrase: "the boy the dog". As already explained, the above LZ1 algorithm compresses data by looking for repeated sequences of characters in the data stream. For example, in the phrase "the boy the dog" the word "the" repeats itself in the sentence and therefore can be compressed. The compression would be accomplished by using the following series of steps:

First, the phrase is stored in a Content Addressable Memory (CAM), which can store one 8-bit ASCII character per address and commonly is called a "history buffer", which may be any size, but in a typical embodiment may have a 2 Kbyte, 1 Kbyte or 512 byte size.

| Address | data | |
| --- | --- | --- |
| 00 | t | |
| 01 | h | |
| 02 | e | |
| 03 | | |
| 04 | b | |
| 05 | o | |
| 06 | y | |
| 07 | | |
| 08 | t <==== | |
| 09 | h <==== | repeated string of characters |
| 10 | e <==== | |
| 11 | <==== | |
| 12 | d | |
| 13 | o | |
| 14 | g | |

Second, the repeated string of characters is identified, as shown above.

Third, the starting address of the first instance of the repeated string, called the "displacement" (here displacement=00), is recorded.

Fourth, the "length" of the repeated data string (here the data length=04) also is recorded.

Fifth, the non-repeated characters (i.e. "raw" data) are output as is, but only displacement and data length is output for the entire repeated character string. In the present example, the output for this compressed sentence would be:

| | Data | |
|---|---|---|
| Byte | 1 | t |
| | 2 | h |
| | 3 | e |
| | 4 | |
| | 5 | b |
| | 6 | o |
| | 7 | y |
| | 8 | |
| | 9 | length = 04, displacement = 00 |
| | 10 | d |
| | 11 | o |
| | 12 | g |

Those of ordinary skill in the art will appreciate that the hardware in FIG. 1 may vary depending on the implementation. For example, other peripheral devices, such as DVD-ROM drives and the like, may be used in addition to or in place of the hardware depicted in FIG. 1. The depicted example is not meant to imply architectural limitations with respect to the present invention. For example, the processes of the present invention may be applied to multiprocessor data processing systems. Furthermore, many other alternative system configurations utilizing the present invention may be used in place of data processing system 100. For example, one computer system, such as a server, may include a data compression engine for compressing all data sent to it while the remaining computer systems may each include a decompression engine to decompress all data they receive from the server.

Figure 2:
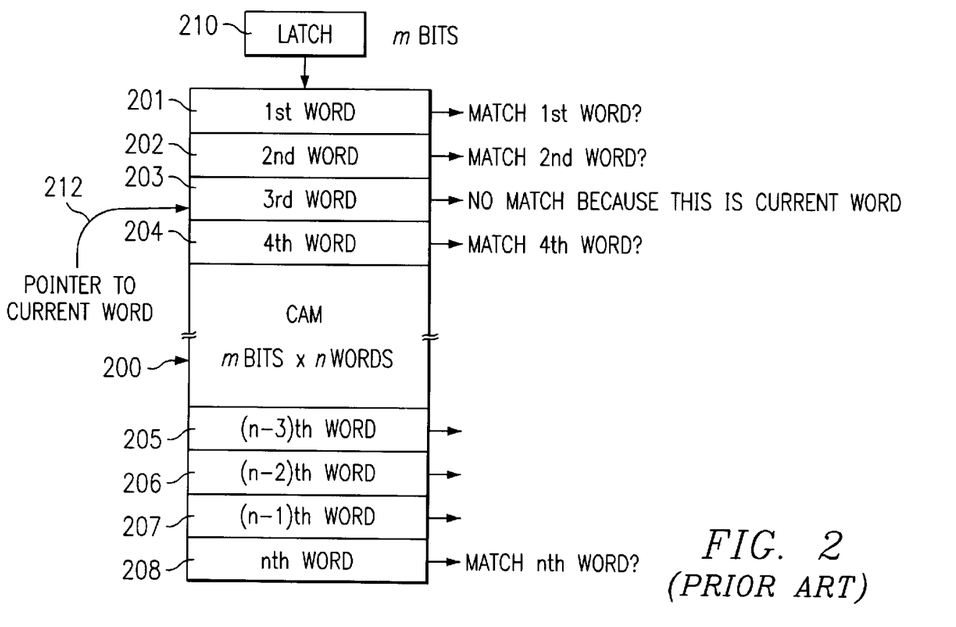
FIG. 2 depicts a high level block diagram illustrating a prior art CAM write and compare function.

With reference to FIG. 2, a high level block diagram illustrating a prior art content addressable memory (CAM) write and compare function is depicted. A CAM is a storage device in which the data is accessed by comparing the content of the data stored rather than addressing a predetermined location. CAM 200 is an array of n words 201–208, each of which is m bits wide. Control logic (not shown) writes data words, launched by latch 210, to sequential CAM 200 word locations 201–208 starting with the 1st word location 201. After the $n^{th}$ word location 208 is written and the CAM is filled, the control logic writes the next data word into the 1st word location 201 and proceeds sequentially through the CAM from there. While a data word is being written to a CAM location, such as word location 203 in the depicted example identified by pointer 212, the word is also compared to previously written words in locations 201–202, 204–208. Since the compare and write are the same data, the CAM word being written is not used in determining a match. The result is that there is always one CAM word that is not available for matching.

Figure 3:
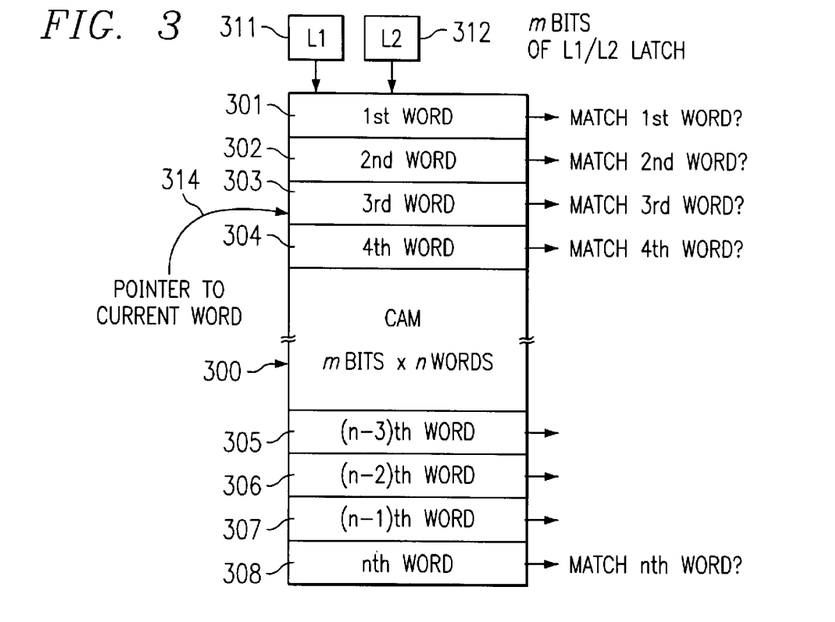
FIG. 3 depicts a high level block diagram illustrating a CAM write and compare function in accordance with an embodiment of the present invention.

With reference now to FIG. 3, a high level block diagram illustrating a CAM write and compare function is depicted in accordance with an embodiment of the present invention. Rather than utilizing a single latch 210 as in the prior art, a master/slave (or L1/L2 if using LSSD designs) latch arrangement is used to launch data into the compare logic and the master CAM latch 311. The compare result is latched into a slave latch 312. The data in the master latch 311 is used for comparison to the CAM location while the slave latch 312 is used to write to the CAM location. The compare function is performed first and then the write function is performed. By doing this, the current CAM location still contains the older data that can be compared against the new data.

Figure 4:
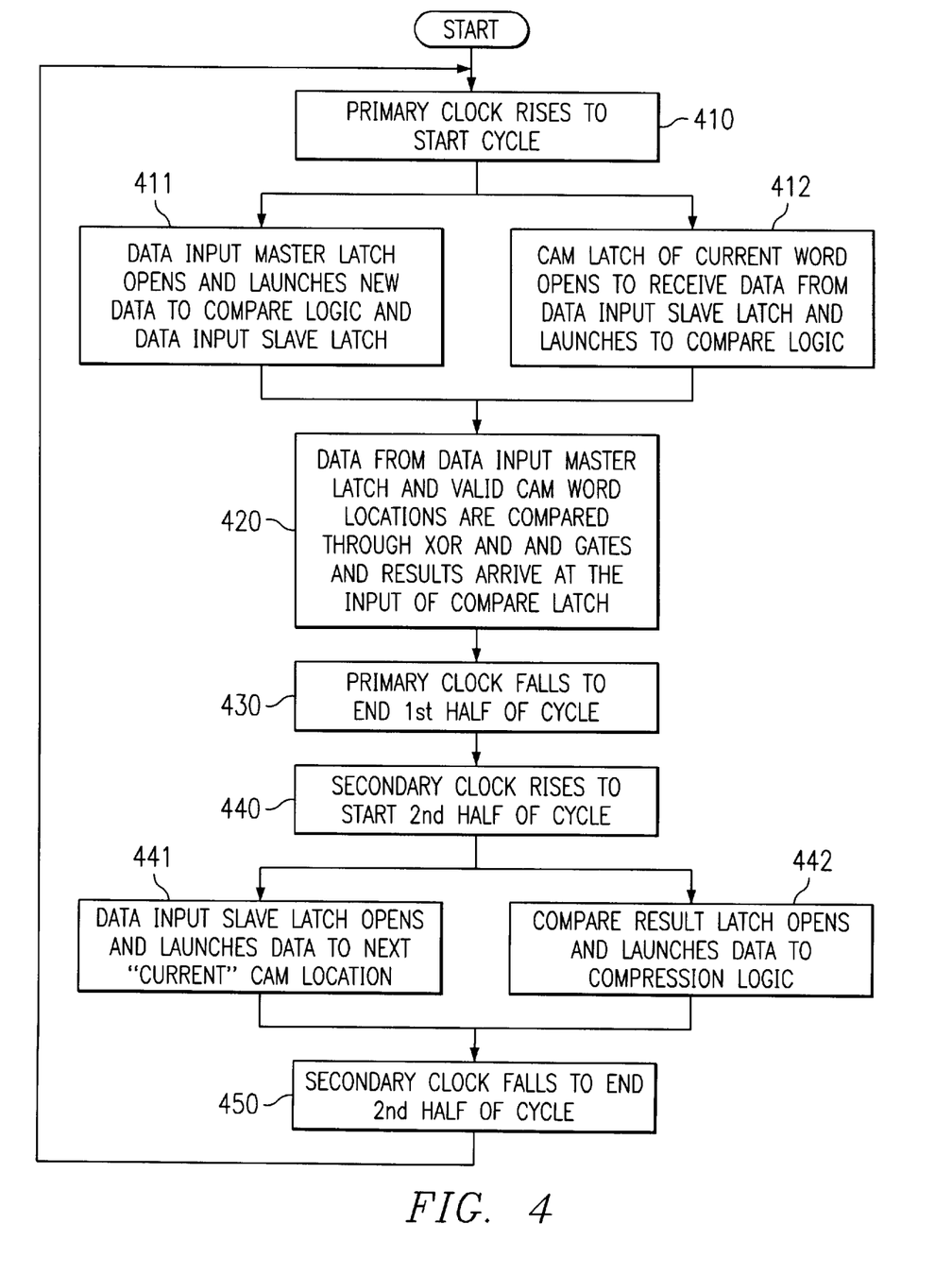
FIG. 4 depicts a flowchart illustrating a process for making all CAM words available for comparison in accordance with the present invention.

With reference now to FIG. 4, a flowchart illustrating a process for making all CAM words available for comparison is depicted in accordance with the present invention. To begin, new data to be compared is present at the input of the data input master latch. This data may come from any of a number of sources and is not pertinent to this invention. A rising edge on the primary clock (step 410) opens that latch to receive and store the data and launches that data to the input of the slave latch and to the compare logic (step 411). The rising edge of this clock, combined with control logic opens the current CAM latch to receive, store and launch the previous data word (step 412) as described below. The rising edge of the primary clock initiates the first half of the cycle. During this first half cycle, the data is stored and launched as described above, then propagates through the comparison logic (step 420), most easily described by exclusive-or functions followed by an and function, and then arrives at the input of the compare latch to store the compare results. The primary clock falls (step 430), closing the master type latches, and ending the first half cycle. At this point, a comparison for all CAM word locations has taken place and the result of the compare, true or false, is present at the input of the compare latch of each word. In addition, the current data word is present at the input of data input slave latch. The secondary clock rises to begin the second half cycle (step 440). The data input slave latch opens to receive, store, and launch the current data word (step 441) and the compare latch for each CAM word opens to receive, store, and launch to compression logic (step 442) the result of the compare logic from the first half of the cycle. During the second half of the cycle, data from the data input slave latch is propagated to the next CAM word location to be written, so that, in the next cycle, the current word becomes the previous word as mentioned above. The secondary clock closes (step 450) to end the second half cycle.

Figure 5:
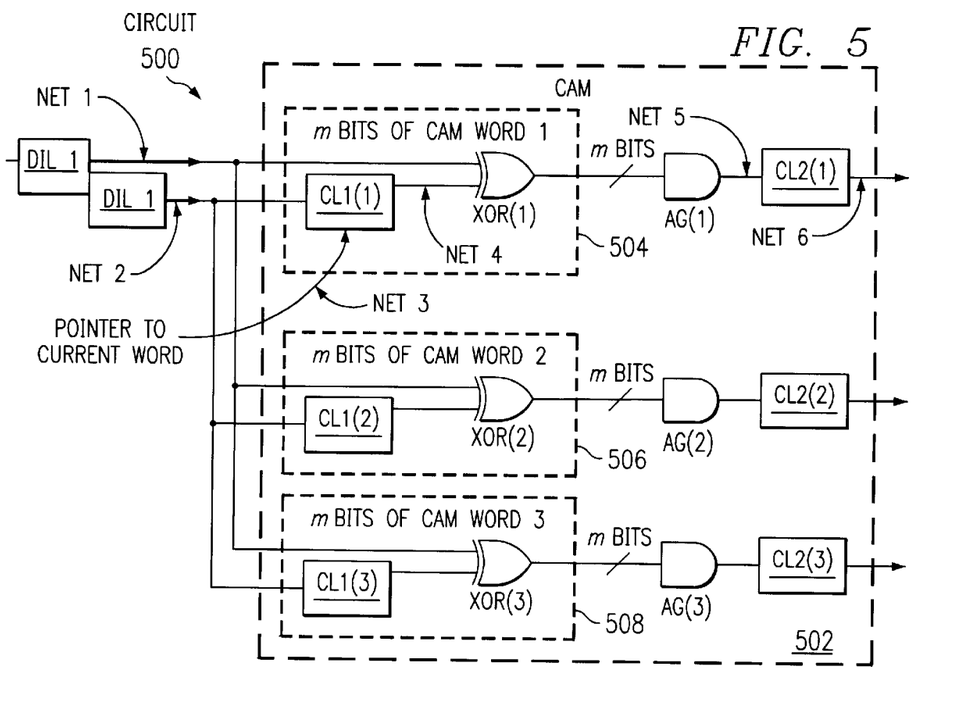
FIG. 5 depicts a logic diagram of a circuit suitable for making all CAM words available for compare in accordance with the present invention.

With reference now to FIG. 5, a logic diagram of a circuit suitable for making all CAM words available for compare is depicted in accordance with the present invention. Logic Circuit 500 enables all CAM words to be available for comparison while also writing new data into the current CAM word. Logic circuit 500 includes a master latch DIL1 and a slave latch DIL2. New data, m bits wide, where m is the number of bits in each word within CAM 502, to be compared with the existing data in content addressable memory (CAM) 502, is launched into the master latch DIL1. The master latch DIL1 is coupled to both the slave latch DIL2 and a first input of each of Exclusive OR gates XOR(1)–XOR(3) corresponding to CAM words 1-3. Slave latch DIL2 is coupled to the input of each CAM word latch CL1(1)–CL1(3). The output Net 4 of each CAM word latch CL1(1)–CL1(3) is coupled to a second input of its respective Exclusive OR gate XOR(1)–XOR(3).

The m bit wide output of each Exclusive OR gates XOR(1)–XOR(3) is coupled to the inputs of corresponding AND gates AG(1)–AG(3). The one bit output Net 5 of each AND gate AG(1)–AG(3) is coupled to the input of the corresponding compare result latch CL2(1)–CL2(3). The output of each of these compare result latches CL2(1)–CL2(3) is then launched into the compression logic (not shown).

A pointer to the current word Net 3 indicates which of the CAM word latches CL1(1)–CL1(3) should be overwritten with the new data.

Although depicted with three CAM words and positive compare logic, the present invention may be applied to a CAM having any number of words and any other logic that indicates a match (e.g. exclusive NORs, NANDs, NORs).

Figure 6:
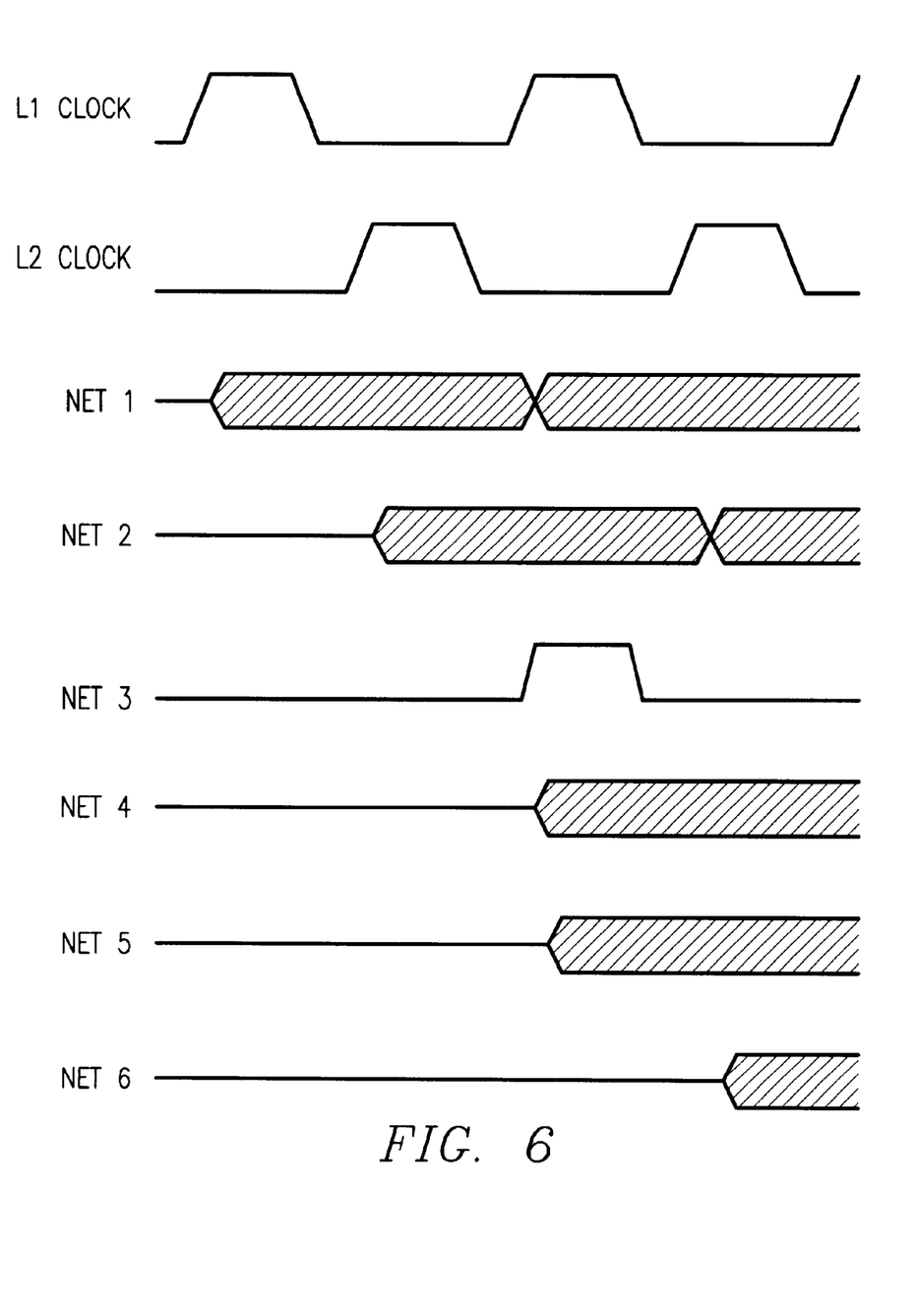
FIG. 6 depicts a timing diagram illustrating the operation of circuit 500 in FIG. 5 in accordance with the present invention.

With reference now to FIG. 6, a timing diagram illustrating the operation of circuit 500 in FIG. 5 is depicted in accordance with the present invention. The data to be compared is launched Net 1 from the master latch DIL1 during the first half of the cycle. The data to be written to the CAM latch CL1 for the current CAM word is launched Net 2 from the slave latch DIL2 during the second half of the cycle. Also during the second half of the cycle, the results of the compare are written Net 5 into the compare result latch CL2. The compare Net 1 occurs during the first (L1) half cycle, and the write Net 2 to the current CAM word occurs during the second (L2) half cycle. Thus, during the compare, the contents of the CAM latches CL1 have the old contents and the new data is not written into the CAM latch CL1 until after the compare has been performed. Furthermore, any particular one of the CAM latches CL1(1)–CL1(3) is not overwritten with the new data from slave latch DIL2 unless the pointer to the current word is pointing to its particular word. In the example illustrated in FIG. 5, the pointer to the current word is pointing to CAM word 1 504, thus only the CAM latch CL1(1) for CAM word 1 504 will be overwritten with the new data. There are no race conditions (anomalous behavior due to unexpected critical dependence on the relative timing of events) using the L1/L2 or master/slave latching methods.

It is important to note that while the present invention has been described primarily with reference to a master/slave latch combination, other types of latches may be used in place of the master/slave latch combination. For example, an L1/L2 latch combination may utilized in place of the master/slave latch arrangement. An L1/L2 latch is the functional equivalent of a master/slave latch. Master/slave latches are triggered off of a clock edge whereas L1/L2 latches are triggered by a clock level.

The description of the present invention has been presented for purposes of illustration and description, and is not intended to be exhaustive or limited to the invention in the form disclosed. Many modifications and variations will be apparent to those of ordinary skill in the art. The embodiment was chosen and described in order to best explain the principles of the invention, the practical application, and to enable others of ordinary skill in the art to understand the invention for various embodiments with various modifications as are suited to the particular use contemplated.

What is claimed is:

1. A circuit for accessing all memory words within a memory device for comparison with new data, comprising:
   a first latch and second latch combination;
   a plurality of memory words within a memory device;
   compare logic for each of the plurality of memory words;
   wherein the new data is launched onto the compare logic from the first latch for comparison with old data within each of the memory words prior to launching the new data from the second latch into one of the plurality of memory words; and
   wherein the compare logic includes a compare logic unit for each of the plurality of memory words, each compare logic unit including:
      an exclusive OR gate for each bit of a respective one of the plurality of memory words, each exclusive OR gate having a first input coupled to an output of the first latch and a second input coupled to an output from the respective one of the plurality of memory words;
      an AND gate with a plurality of inputs, each of the plurality of inputs is coupled to a respective output of a respective exclusive OR gate; and
      an output latch having an input coupled to an output of the AND gate.

2. The circuit as recited in claim 1, wherein the memory device is a content addressable memory.

3. The circuit as recited in claim 1, wherein the first latch and second latch combination is a master/slave latch combination.

4. The circuit as recited in claim 1, wherein the first latch and second latch combination is an L1/L2 latch combination.

5. A system for making all memory words within a memory device available for comparison by a data compressor, comprising:
   a first latch;
   a second latch;
   during a first half of a write cycle, means for storing a first copy of new data in said first latch, propagating said new data from said first latch to said second latch such that a second copy of said new data is stored in said second latch, and propagating said new data from said first latch to compare logic, said first copy of said new data to be compared with a plurality of old data each contained within a respective one of a plurality of words within the memory device;
   means for comparing said first copy of said new data stored in said first latch with each of said plurality of memory words during said first half of said write cycle; and
   during a second half of said write cycle, means for writing said second copy of said new data from said second latch to a next one of said plurality of words, wherein said comparison is completed before said writing occurs, and further wherein all of said plurality of words are available for comparison.

6. The system as recited in claim 5, wherein the memory device is a content addressable memory.

7. The system as recited in claim 5, wherein the first latch and the second latch form a master/slave latch combination, wherein the first latch is the master latch and the second latch is the slave latch.

8. The system as recited in claim 5, wherein the first and second latch form an L1/L2 latch combination wherein the first latch is the L1 latch and the second latch is the L2 latch.

9. The system according to claim 5, further comprising:
   a primary clock;
   a secondary clock;
   said first half of said write cycle being from a rising edge of said primary clock to a falling edge of said primary clock; and
   said second half of said write cycle being from a rising edge of said secondary clock to a falling edge of said secondary clock.

10. A system for making all memory words within a memory available for comparison in a data compressor, comprising:
    means for launching new data, to be compared with old data, into a first latch, wherein said new data is stored in said first latch;
    means for launching the new data front the first latch into a second latch and compare logic for each of a plurality of memory words, wherein said new data is stored in said second latch;
    means for comparing said new data stored in said first latch with each of said plurality of memory words; and
    means for launching the new data from the second latch into a word latch for a current one of the plurality of memory word words, wherein said new data stored in said second latch is written into said current one of said word latch, and further wherein data stored in said second latch is used for writing into said memory and data stored in said first latch is used for comparing.

11. The system as recited in claim 10, wherein the first latch is a master latch and the second latch is a slave latch.

12. The system as recited in claim 10, wherein the first and second latch from an L1/L2 latch combination.

13. The system as recited in claim 10, wherein the memory is a content addressable memory and the memory words are content addressable memory words.

14. A method for making all memory words within a memory available for comparison in a data compressor, the method comprising:

launching new data, to be compared with old data, into a first latch, wherein said new data is stored in said first latch;

launching the new data from the first latch into a second latch and compare logic for each of a plurality of memory words, wherein said new data is stored in said second latch;

comparing said new data stored in said first, latch with each of said plurality of memory words; and launching the new data from the second latch into a word latch for a current one of the plurality of memory words, wherein said new data stored in said second latch is written into said current one of said word latch, and further wherein data stored in said second latch is used for writing into said memory and data stored in said first latch is used for comparing.

15. The method as recited in claim 14, wherein the first latch is a master latch and the second latch is a slave latch.

16. The method as recited in claim 14, wherein the first and second latch form an L1/L2 latch combination.

17. The method as recited in claim 14, wherein the memory is a content addressable memory and the memory words are content addressable memory words.

18. A method for making all memory words within a memory device available for comparison by a data compressor, the method comprising:

during a first half of a write cycle, storing a first copy of new data in a first latch, propagating said new data from said first latch to a second latch such that a second copy of said new data is stored in said second latch, and propagating said new data from said first latch to compare logic, said first copy of said new data to be compared with a plurality of old data each contained within a respective one of a plurality of words within the memory device;

comparing said first copy of said new data stored in said first latch with each of said plurality of memory words during said first half of said write cycle; and during a second half of said write cycle, writing said second copy of said new data from said second latch to a next one of said plurality of words, wherein said comparing step is completed before said writing step, and further wherein all of said plurality of words are available for comparison.

19. The method as recited in claim 18, wherein the memory device is a contact addressable memory.

20. The method as recited in claim 18, wherein the first latch and the second latch form a master/slave latch combination, wherein the first latch is the master latch and the second latch is the slave latch.

21. The method as recited in claim 18, wherein the first and second latch form an L1/L2 latch combination wherein the first latch is the L1 latch and the second latch is the L2 latch.

22. The method according to claim 18, further comprising the steps of:

generating a primary clock;

generating a secondary clock;

beginning said first half of said write cycle upon a rising edge of said primary clock;

ending said first half of said write cycle upon a falling edge of said primary clock;

beginning said second half of said write cycle upon a rising edge of said secondary clock; and ending said second half of said write cycle upon a falling edge of said secondary clock.

* * * * *

UNITED STATES PATENT AND TRADEMARK OFFICE
CERTIFICATE OF CORRECTION

PATENT NO. : 6,615,310 B1
DATED : September 2, 2003
INVENTOR(S) : Ridings

It is certified that error appears in the above-identified patent and that said Letters Patent is hereby corrected as shown below:

<u>Title page,</u>
Item [74], *Attorney, Agent or Firm*, delete "Lisa L. Yociss" and insert -- Lisa L. B. Yociss --.

<u>Column 8,</u>
Line 57, after "data", delete "front" and insert -- from --.

<u>Column 9,</u>
Line 22, after "first", delete ",".

<u>Column 10,</u>
Line 18, after "is a", delete "contact" and insert -- content --.

Signed and Sealed this

Twentieth Day of January, 2004

JON W. DUDAS
*Acting Director of the United States Patent and Trademark Office*